(12) United States Patent
Carpenter et al.

(10) Patent No.: US 12,080,978 B2
(45) Date of Patent: Sep. 3, 2024

(54) HIGH FREQUENCY IMPEDANCE MATCHING EDGE LAUNCH RF CONNECTOR

(71) Applicant: Raytheon Company, Waltham, MA (US)

(72) Inventors: Benjamin W. Carpenter, Tucson, AZ (US); Ryan D. Dewitt, Tucson, AZ (US); Michael R. Beylor, Tucson, AZ (US)

(73) Assignee: Raytheon Company, Tewksbury, MA (US)

( * ) Notice: Subject to any disclaimer, the term of this patent is extended or adjusted under 35 U.S.C. 154(b) by 409 days.

(21) Appl. No.: 17/565,691

(22) Filed: Dec. 30, 2021

(65) Prior Publication Data

US 2023/0216256 A1 Jul. 6, 2023

(51) Int. Cl.
| | |
|---|---|
| H01R 12/00 | (2006.01) |
| H01R 24/50 | (2011.01) |
| H01R 43/20 | (2006.01) |
| H01R 103/00 | (2006.01) |

(52) U.S. Cl.
CPC ........... *H01R 24/50* (2013.01); *H01R 43/205* (2013.01); *H01R 2103/00* (2013.01)

(58) Field of Classification Search
CPC .. H01R 24/50; H01R 43/205; H01R 2103/00; H01R 12/57; H01R 13/6594; H01R 13/6597; H01R 24/44; H05K 2201/10189; H05K 1/181; H05K 3/3405

See application file for complete search history.

(56) References Cited

U.S. PATENT DOCUMENTS

| | | | | |
|---|---|---|---|---|
| 5,265,182 A | * | 11/1993 | Hartley | G02B 6/3874 385/59 |
| 5,928,000 A | * | 7/1999 | Rudisill | H04M 1/0216 439/700 |
| 6,166,615 A | * | 12/2000 | Winslow | H01P 1/04 333/260 |
| 6,682,354 B2 | | 1/2004 | Carson et al. | |

(Continued)

FOREIGN PATENT DOCUMENTS

| | | |
|---|---|---|
| EP | 3432424 A1 | 1/2019 |
| JP | 20190106681 A | 6/2019 |

OTHER PUBLICATIONS

International Search Report and Written Opinion mailed Jan. 25, 2023 in corresponding International Application No. PCT/US2022/077649.

*Primary Examiner* — Abdullah A Riyami
*Assistant Examiner* — Nelson R. Burgos-Guntin

(57) ABSTRACT

An edge launch radio frequency (RF) signal connector includes ground contact tabs that have radially extending arms. The arms cover a gap between a substrate, such as a circuit board, and the connector to reduce the RF ground path between the RF reference ground and a signal pin supported by the connector. The arms extend radially inwardly from the protruding ground contact tabs toward a central support aperture that supports the signal pin. The arms and the ground contact tabs are formed integrally with the main connector body as one piece. The arms and the ground contact tabs may be planar in shape such that the arms and the ground contact tabs lie flush on the substrate when the connector is arranged over the edge of the substrate.

20 Claims, 2 Drawing Sheets

(56) References Cited

U.S. PATENT DOCUMENTS

| | | | |
|---|---|---|---|
| 7,097,499 B1 * | 8/2006 | Purdy | H01R 9/0521 |
| | | | 439/578 |
| 7,344,381 B2 | 3/2008 | Kerekes | |
| 7,575,474 B1 | 8/2009 | Dodson et al. | |
| 7,665,998 B2 | 2/2010 | Kressner et al. | |
| 8,430,675 B2 | 4/2013 | Hardy et al. | |
| 9,433,083 B2 | 8/2016 | Moncayo et al. | |
| 10,516,224 B1 * | 12/2019 | Taylor | H05K 3/366 |
| 2002/0081910 A1 * | 6/2002 | Kihira | H01R 12/7082 |
| | | | 439/700 |
| 2007/0149027 A1 * | 6/2007 | Chen | H01R 12/7052 |
| | | | 439/345 |
| 2014/0154906 A1 * | 6/2014 | Lee | H01R 13/622 |
| | | | 439/321 |
| 2018/0048101 A1 * | 2/2018 | Maruyama | H05K 3/308 |
| 2019/0081443 A1 * | 3/2019 | So | H01R 43/20 |
| 2023/0411884 A1 * | 12/2023 | Brocheton | H01R 24/50 |

\* cited by examiner

HIGH FREQUENCY IMPEDANCE MATCHING EDGE LAUNCH RF CONNECTOR

FIELD OF DISCLOSURE

The disclosure relates to an edge launch radio frequency signal connector.

DESCRIPTION OF THE RELATED ART

Various applications use electronic devices having substrates, such as circuit boards that may include electronic components. Exemplary applications include radio frequency (RF) interface applications. RF interfaces may be utilized in military applications and commercial high frequency RF applications, such as 5G. The circuit board substrate includes a connector that is mounted to the substrate and configured to receive a cable from another substrate or another electronic device. The cable enables the substrate to transmit and receive RF signals. The connector may be edge-mounted to the substrate, i.e., the connector extends over an edge of the circuit board.

Conventional edge launch RF connectors may be deficient due to challenges in mounting the edge launch connector flush with a circuit board. Inadequate mounting of the connector, such as misalignment which forms gaps between the connector and the circuit board, may result in poor RF transition at higher frequencies. Consequently, the overall performance of the assembly is reduced due to the manufacturing tolerances between the RF connector and the circuit board.

One prior attempt to improve the connection between the RF connector and the circuit board includes manual touch labor soldering the connector grounds to the circuit board to cover the gaps in the ground plane. However, in addition to adding time and cost in manufacturing the assembly of the RF connector and the circuit board, the manual soldering process increases touch time on the circuit boards. The increased handling of the circuit board may lead to possible defects in the assembly.

SUMMARY OF THE DISCLOSURE

The present application provides an edge launch radio frequency (RF) signal connector that includes ground contact tabs with protruding arms. The arms extend from the ground contacts tabs to cover a gap between a substrate, e.g., a circuit board, and the connector body of the edge launch RF signal connector to reduce the RF ground path between the RF reference ground and a signal pin supported by the connector body. The arms extend radially inwardly from the protruding ground contact tabs toward a central support aperture of the connector body that supports the signal pin. The arms and the ground contact tabs may be planar in shape such that the arms and the ground contact tabs lie flush against the substrate when the edge launch RF signal connector is connected along the edge of the substrate.

Using the ground contact tab having the arms eliminates the need for manual touch labor soldering and minimizes the impact of gaps formed by manufacturing tolerances between the substrate and the connector. The ground contact tabs having the arms are particularly advantageous in high frequency applications in which defects in the RF transition have especially negative effects on the transmission loss. The ground contact tabs and the arms may be formed integrally with the main connector body as one piece which also enables less complex manufacturing and assembly of the connector and the substrate.

According to an aspect of the disclosure, an edge launch RF signal connector may include an arm that protrudes from a ground contact tab to reduce a ground path between the RF reference ground and a signal pin.

According to an aspect of the disclosure, an edge launch RF signal connector may include a connector body having an integrally formed ground contact tab and an arm that covers a gap between a substrate and the connector body.

According to an aspect of the disclosure, an edge launch RF signal connector may include a ground contact tab having a portion that extends radially inwardly toward a signal pin supported by the edge launch RF signal connector.

According to an aspect of the disclosure, a method of connecting an electronic device to a substrate may include reducing the ground path between the RF references ground and the signal pin.

According to an aspect of the disclosure, an edge launch RF signal connector includes a connector body having a main body defining a central support aperture, and at least one ground contact tab that is radially spaced from the central support aperture and protrudes from the main body, the at least one ground contact tab being configured to ground to a substrate and having an arm that extends radially inwardly along the main body toward the central support aperture, and a signal pin supported within the central support aperture of the connector body.

According to an embodiment of any paragraph(s) of this summary, the at least one ground contact tab and the arm may be integrally formed with the main body as one piece.

According to an embodiment of any paragraph(s) of this summary, the at least one ground contact tab and the arm may be rectilinear in shape.

According to an embodiment of any paragraph(s) of this summary, the at least one ground contact tab and the arm may be planar and configured to lie flush on the substrate.

According to an embodiment of any paragraph(s) of this summary, the arm may extend a radial distance along a face of the main body, the distance being greater than a radius of the face.

According to an embodiment of any paragraph(s) of this summary, the arm may extend perpendicular to the at least one ground contact tab.

According to an embodiment of any paragraph(s) of this summary, a length of the at least one ground contact tab that protrudes from the main body may be longer than a length of the arm that protrudes from the main body.

According to an embodiment of any paragraph(s) of this summary, the at least one ground contact tab and the arm may form an L-shape.

According to an embodiment of any paragraph(s) of this summary, the at least one ground contact tab and the arm may have a same thickness.

According to an embodiment of any paragraph(s) of this summary, the arm may have a thickness that is equal to or less than a diameter of the central support aperture.

According to an embodiment of any paragraph(s) of this summary, the at least one ground contact tab may protrude perpendicular to a face of the main body that defines the central support aperture.

According to an embodiment of any paragraph(s) of this summary, an outer peripheral surface of the at least one ground contact tab may define an outermost surface of the edge launch RF signal connector.

According to an embodiment of any paragraph(s) of this summary, the outer peripheral surface of the at least one ground contact tab and an outer peripheral surface of the main body may have a same radial distance from the central support aperture.

According to an embodiment of any paragraph(s) of this summary, the at least one ground contact tab may include two ground contact tabs disposed on opposite sides of the central support aperture.

According to an embodiment of any paragraph(s) of this summary, the two ground contact tabs may be arranged symmetrically.

According to an embodiment of any paragraph(s) of this summary, the two ground contact tabs may be identical in shape and size.

According to an embodiment of any paragraph(s) of this summary, wherein the tab may extend over a gap between the substrate and the main body.

According to another aspect of the disclosure, a method of connecting an electronic device to a substrate includes arranging a connector body on the substrate, the connector body having a main body defining a central support aperture that supports a signal pin, and at least one ground contact tab that is radially spaced from the central support aperture and protrudes from the main body, contacting the at least one ground contact tab against the substrate to ground to the substrate, and covering a gap between the substrate and the connector body by an arm of the at least one ground contact tab that extends radially inwardly along the main body toward the central support aperture.

According to an embodiment of any paragraph(s) of this summary, the method may include reducing an RF ground path via the arm.

According to an embodiment of any paragraph(s) of this summary, the method may include contacting the at least one ground contact tab against the substrate includes arranging the at least one ground contact tab and the arm to be flush with a surface of the substrate.

To the accomplishment of the foregoing and related ends, the disclosure comprises the features hereinafter fully described and particularly pointed out in the claims. The following description and the annexed drawings set forth in detail certain illustrative embodiments of the disclosure. These embodiments are indicative, however, of but a few of the various ways in which the principles of the disclosure may be employed. Other objects, advantages and novel features of the disclosure will become apparent from the following detailed description of the disclosure when considered in conjunction with the drawings.

BRIEF DESCRIPTION OF DRAWINGS

The annexed drawings, which are not necessarily to scale, show various aspects of the disclosure.

DETAILED DESCRIPTION

The principles described herein have particular application in electronic device applications, such as in applications that require connection between a substrate, e.g., a circuit card assembly (CCA), printed circuit board, or printed wire board, and other radio frequency (RF) assemblies, to allow signal connections. Exemplary applications include any suitable RF interface applications, military applications, and commercial high frequency RF applications, such as 5G. Any application having an interface in which a signal is transmitted to a circuit board may be suitable. Many other applications may be suitable.

Figure 1:
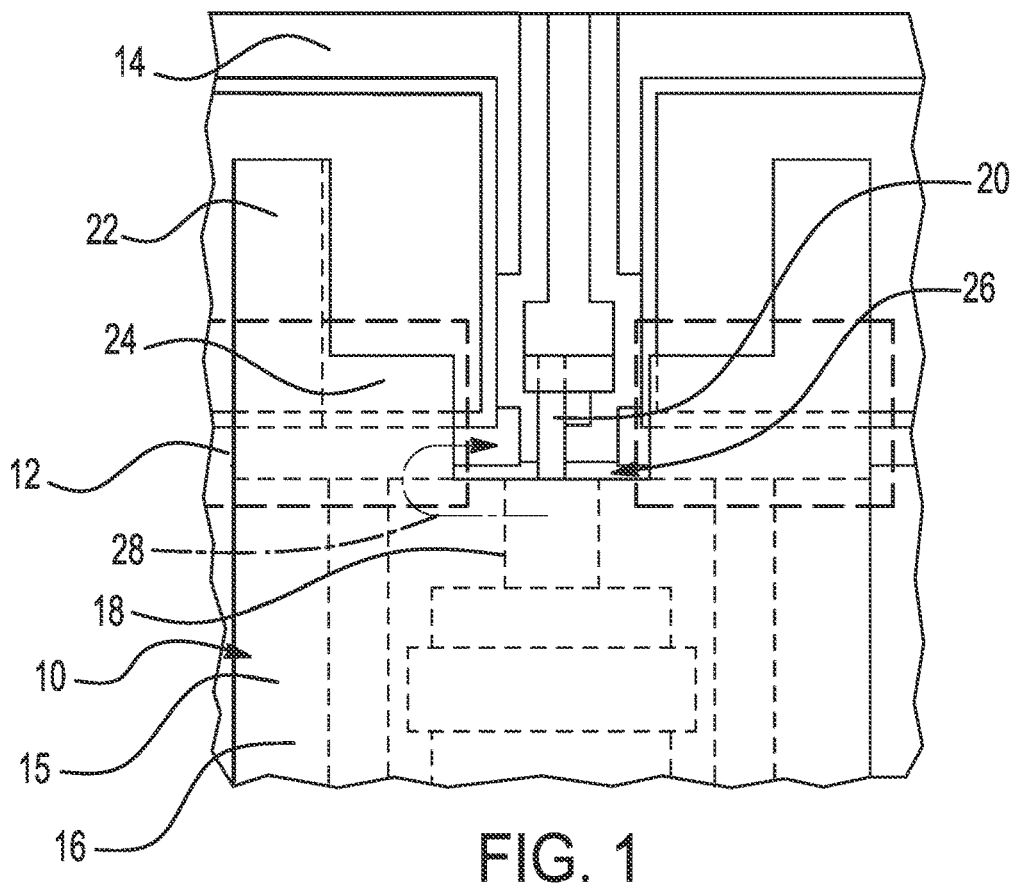
FIG. 1 shows a top view of an edge launch radio frequency (RF) signal connector arranged on a substrate in accordance with an exemplary embodiment of the present application.
Figure 2:
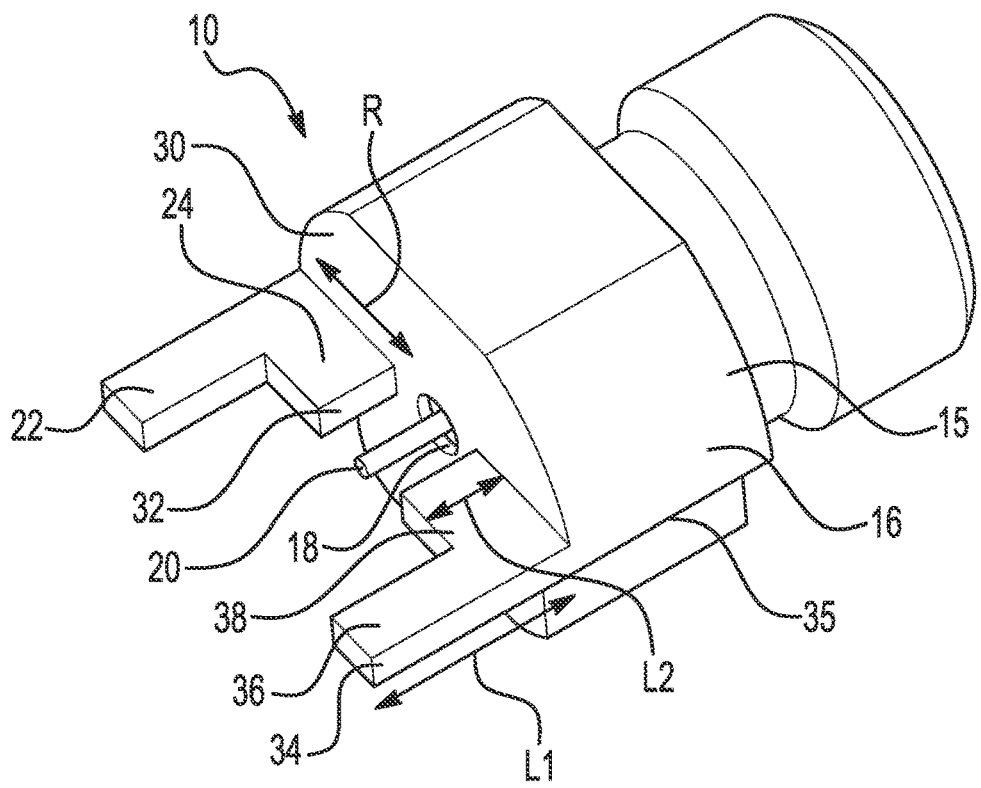
FIG. 2 shows an oblique view of the edge launch RF signal connector of FIG. 1.
Figure 3:
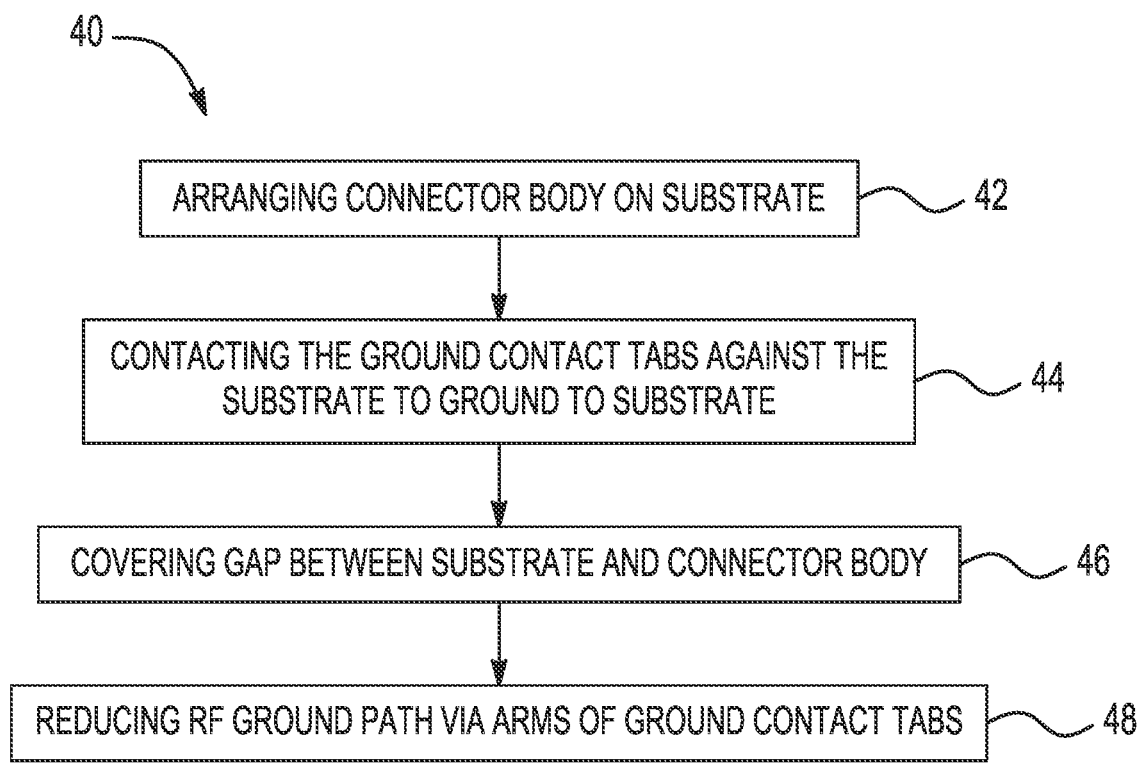
FIG. 3 shows a flowchart illustrating a method of connecting an electronic device to a substrate using the edge launch RF signal connector of FIG. 1.

Referring first to FIGS. 1 and 2, an edge launch RF signal connector 10 according to an embodiment of the present application is shown. The edge launch RF signal connector 10 may be any suitable electrical connector and is configured to be mounted to an edge 12 of a substrate 14. The edge launch RF signal connector 10 is configured to be arranged adjacent the substrate 14 and contact the upper surface of the substrate 14. The substrate 14 may be substantially planar, such as a circuit board.

In exemplary applications, the substrate 14 may be part of an electronic device and include electrical components of the electronic device mounted on the substrate 14. The edge launch RF signal connector 10 is configured to receive a mating connector from another substrate or electronic device, such that the edge launch RF signal connector 10 is electrical coupled to the substrate 14 for transmitting and receiving RF power or data signals between the other substrate or electronic device and the electronic device associated with the substrate 14. The edge launch RF signal connector 10 may be configured for use with any suitable electronic device or substrate.

The edge launch RF signal connector 10 includes a connector body 15 having a main body 16 defining a central support aperture 18 and a signal pin 20 that is supported in the central support aperture 18 and extends through the main body 16. The central support aperture 18 may extend through at least part of the main body 16. The signal pin 20 may be connected to a wire or any other suitable electrical connection that is supported by the connector body 15.

The connector body 15 includes at least one ground contact tab 22 that is radially spaced from the central support aperture 18 and protrudes from the main body 16. More than one ground contact tab 22 may be provided. The ground contact tab 22 extends over the substrate 14 and is configured to contact the substrate 14 to ground to the substrate 14. The ground contact tab 22 may be the only part of the connector body 15 that contacts the substrate 14, such that the main body 16 of the connector body 15 is arranged off of the substrate 14 when the components are assembled.

The ground contact tab 22 has an arm 24 that extends radially inwardly along the main body 16 toward the central support aperture 18 and the signal pin 20. The arm 24 is configured to extend over a gap 26 formed between the edge 12 of the substrate 14 and the connector body 15 when the connector body 15 is assembled on the substrate 14. The gap 26 may be formed due to misalignment of the substrate 14 and the edge launch RF signal connector 10.

Using the arm 24 formed on the ground contact tab 22 advantageously shortens an RF ground path 28 between the RF reference ground and the signal pin 20 as compared with conventional ground tabs that do not have a radially extending arm. Accordingly, using the ground contact tab having the protruding arm minimizes the transmission loss caused by substrate and connector placement imperfections.

The ground contact tab 22 and the arm 24 are integrally formed with the main body 15 as one piece, such that the connector body 15 is formed as one continuous part. Forming the connector body 10 as one continuous part enables less complex manufacturing and assembly of the edge launch RF signal connector 10. Any suitable manufacturing method may be used to form the edge launch RF signal connector 10. The edge launch RF signal connector 10 may be formed of any suitable conductive material. Exemplary materials include copper or other non-ferrous materials, and dielectric materials. Exemplary manufacturing processes that may be suitable include casting, stamping, molding, machining, etc. Any suitable additive manufacturing methods may also be used.

The ground contact tab 22 and the arm 24 may have any suitable shape. The ground contact tab 22 and the arm 24 are planar and have a flat surface that contacts the substrate 14. The ground contact tab 22 and the arm 24 extend parallel with the surface of the substrate 14, such that the ground contact tab 22 and arm 24 lie flush on the surface of the substrate 14 when the edge launch RF signal connector 10 is assembled on the substrate 14.

In exemplary embodiments, the ground contact tab 22 and the arm 24 are rectilinear in shape. The ground contact tab 22 may have a straight shape that extends from the main body 16. In other exemplary embodiments, the ground contact tab 22 and/or the arm 24 may have a non-rectilinear shape, such as a tapering shape that tapers radially inwardly toward the central support aperture 18. The arm may be formed to have a triangular or other polygonal shape. The shape of the ground contact tab 22 and the arm 24 extends in a plane that is parallel with the substrate 14 such that the ground contact tab 22 and the substrate 14 engage in a common plane. Many other shapes for the ground contact tab 22 and the arm 24 may be suitable and the shapes may be dependent on the application.

The arm 24 may extend in a direction perpendicular to the direction in which the ground contact tab 22 extends, such that the ground contact tab 22 and the arm 24 form an L-shape. The arm 24 may form a shorter leg of the L-shape as compared with the ground contact tab 22. A length L1 of the ground contact tab 24 that protrudes outwardly from the main body 16 is longer than a length L2 of the arm 24 that protrudes outwardly from the main body 16. The ground contact tab 22 and the arm 24 each extend perpendicular to a face 30 of the main body 16. The face 30 of the main body 16 is an axial endmost surface of the main body 16. The face 30 faces the edge 12 of the substrate 14 when the edge launch RF signal connector 10 is assembled to the substrate 14, such that the gap 26 may be defined between the face 30 and the substrate 14.

The ground contact tab 22 and the arm 24 may have a same thickness and the thickness may be uniform. In other exemplary embodiments, the ground contact tab 22 and the arm 24 may have different thicknesses relative to each other and/or varying thicknesses. The thickness may be equal to or less than the diameter of the central support aperture 18. The thickness is less than the diameter of the main body 16. In other exemplary embodiments, the thickness may be greater than the diameter of the central support aperture 18 but less than the diameter of the main body 16.

The arm 24 extends a radial distance R along the face 30 of the main body 16 toward the central support aperture 18, which is arranged centrally in the face 30. The base of the arm 24 is attached to the face 30 such that the arm 24 and the ground contact tab 22 extend continuously along the main body 16. The radial distance R may be any suitable distance depending on the application, and the radial distance R may not reach the central support aperture 18. The radial distance R may be greater than a radius of the face 30 and the radial distance R may be formed to provide a predetermined spacing between a radially inner edge 32 of the arm 24 and the central support aperture 18.

An outer peripheral surface 34 of the ground contact tab 22 and an outer peripheral surface 35 of the main body 16 have a same radial distance from the central support aperture 18. The ground contact tab 22 and the main body 16 may together define a radially outermost surface of the connector body 15. The connector body 15 may have any suitable shape and the shape may be dependent on the application. A suitable shape may be cylindrical. The connector body 15 may be elongated along a central axis of the connector body 15 along which the signal pin 20 is arranged.

The connector body 15 may include two ground contact tabs 22, 36 that each include a corresponding arm 24, 38. Each of the arms 24, 38 extends over the gap 26 formed between the connector body 15 and the substrate 14. The two ground contact tabs 22, 36 are disposed on opposite sides of the central support aperture 18 and may be arranged symmetrically. The two ground contact tabs 22, 36 are identical in shape and size. The two ground contact tabs 22, 36 are radially spaced from each other and the arms 24, 38 of the two ground contact tabs 22, 36 extend radially toward each other and the central support aperture 18. The ground contact tabs 22, 36 are formed to extend in a same plane such that both of the ground contact tabs 22, 36 lie flush against the substrate 14.

Referring now to FIG. 4, a flowchart illustrating a method 40 of connecting an electronic device to a substrate is shown. The method 40 may include using the edge launch RF signal connector 10 shown in FIGS. 1 and 2 to ground to the substrate 14. Step 42 of the method 40 includes arranging the connector body 15 on the substrate 14. The connector body 15 includes the main body 16 defining the central support aperture 18 that supports the signal pin 20, and the ground contact tabs 22, 36. The ground contact tabs 22, 36 are radially spaced from the central support aperture 18 and protrude from the main body 16.

Step 44 of the method 40 includes contacting the ground contact tabs 22, 36 against the substrate 14 to ground to the substrate 14. Step 44 may include arranging the ground contact tabs 22, 36 and the arms 24, 38 to be flush with a surface of the substrate 14. Step 46 of the method 40 includes covering the gap 26 between the substrate 14 and the connector body 15 by the arms 24, 38 of the at least one ground contact tab that extends radially inwardly along the main body toward the central support aperture. Step 48 of the method 40 includes reducing the RF ground path 28 between the RF reference ground and the signal pin 20 via the arms 24, 38.

Although the disclosure includes certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments. In addition, while a particular feature of the disclosure may have been described above with respect to only one or more of several illustrated embodiments, such feature may be combined with one or more other features of the other embodiments, as may be desired and advantageous for any given or particular application.

What is claimed is:

1. An edge launch radio frequency (RF) signal connector comprising:
a connector body having a main body with (i) a first side configured to receive an RF signal and a second side configured to interface with a substrate and defining a central support aperture and (ii) at least one ground contact tab that is radially spaced from the central support aperture by a first distance and that protrudes from the second side of the main body, the at least one ground contact tab configured to ground to the substrate and having an arm that extends radially inward for a second distance along the main body toward the central support aperture, wherein the second distance is greater than the first distance; and
a signal pin supported within the central support aperture of the connector body.

2. The edge launch RF signal connector according to claim 1, wherein the at least one ground contact tab and the arm are integrally formed with the main body as one piece.

3. The edge launch RF signal connector according to claim 1, wherein the at least one ground contact tab and the arm are rectilinear in shape.

4. The edge launch RF signal connector according to claim 1, wherein the at least one ground contact tab and the arm are planar and configured to lie flush on the substrate.

5. The edge launch RF signal connector according to claim 1, wherein the arm extends the second distance along a face of the main body, the second distance being greater than a radius of the face.

6. The edge launch RF signal connector according to claim 1, wherein the arm extends perpendicular to the at least one ground contact tab.

7. The edge launch RF signal connector according to claim 1, wherein a length of the at least one ground contact tab that protrudes from the second side of the main body is longer than a length of the arm that protrudes from the second side of the main body.

8. The edge launch RF signal connector according to claim 1, wherein the at least one ground contact tab and the arm form an L-shape.

9. The edge launch RF signal connector according to claim 1, wherein the at least one ground contact tab and the arm have a same thickness.

10. The edge launch RF signal connector according to claim 1, wherein the arm has a thickness that is equal to or less than a diameter of the central support aperture.

11. The edge launch RF signal connector according to claim 1, wherein the at least one ground contact tab protrudes perpendicular to a face on the second side of the main body that defines the central support aperture.

12. The edge launch RF signal connector according to claim 1, wherein an outer peripheral surface of the at least one ground contact tab defines an outermost surface of the edge launch RF signal connector.

13. The edge launch RF signal connector according to claim 12, wherein the outer peripheral surface of the at least one ground contact tab and an outer peripheral surface of the main body have a same radial distance from the central support aperture.

14. The edge launch RF signal connector according to claim 1, wherein the at least one ground contact tab includes two ground contact tabs disposed on opposite sides of the central support aperture.

15. The edge launch RF signal connector according to claim 14, wherein the two ground contact tabs are arranged symmetrically.

16. The edge launch RF signal connector according to claim 14, wherein the two ground contact tabs are identical in shape and size.

17. The edge launch RF signal connector according to claim 1, wherein the arm extends over a gap formed between an edge of the substrate and the second side of the main body to shorten an RF ground path between an RF reference ground of the substrate and the signal pin.

18. A method of connecting an electronic device to a substrate, the method comprising:
arranging a connector body on the substrate, the connector body having a main body with (i) a first side configured to receive a radio frequency (RF) signal and a second side configured to interface with the substrate and defining a central support aperture that supports a signal pin and (ii) at least one ground contact tab that is radially spaced from the central support aperture by a first distance and that protrudes from the second side of the main body;
contacting the at least one ground contact tab against the substrate to ground to the substrate; and
covering a gap formed between an edge of the substrate and the second side of the main body by an arm of the at least one ground contact tab that extends radially inward for a second distance along the main body toward the central support aperture, wherein the second distance is greater than the first distance.

19. The method according to claim 18, further comprising reducing an RF ground path via the arm.

20. The method according to claim 18, wherein contacting the at least one ground contact tab against the substrate includes arranging the at least one ground contact tab and the arm to be flush with a surface of the substrate.

* * * * *